(12) United States Patent
Schultz (10) Patent No.: US 9,229,067 B2
(45) Date of Patent: *Jan. 5, 2016

(54) APPARATUS AND METHOD FOR IN-FIELD MAGNETIC MEASUREMENTS

(71) Applicant: Data Security, Inc., Lincoln, NE (US)

(72) Inventor: Robert A. Schultz, Lincoln, NE (US)

(73) Assignee: Data Security, Inc., Lincoln, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,062

(22) Filed: May 2, 2014

(65) Prior Publication Data

US 2014/0239948 A1 Aug. 28, 2014

Related U.S. Application Data

(63) Continuation of application No. 13/193,206, filed on Jul. 28, 2011, now Pat. No. 8,717,014, which is a continuation of application No. 12/171,626, filed on Jul. 11, 2008, now Pat. No. 7,994,773.

(51) Int. Cl.
*G01R 33/02* (2006.01)
*G01R 33/00* (2006.01)
(Continued)

(52) U.S. Cl.
CPC .......... *G01R 33/0023* (2013.01); *G01R 33/072* (2013.01); *G01R 35/005* (2013.01)

(58) Field of Classification Search
CPC ................................................... G01R 33/072
USPC .................................................. 324/247, 260
See application file for complete search history.

(56) References Cited

U.S. PATENT DOCUMENTS 5,689,185 A 11/1997 Widdershoven et al.
5,953,683 A 9/1999 Hansen et al.
(Continued)

FOREIGN PATENT DOCUMENTS

JP 2000187065 A 7/2000
JP 2002004742 A 1/2002
(Continued)

OTHER PUBLICATIONS

Alphalab, Inc.; "The TriField Meter 100XE"; http://www.trifield.com/content/the-trifield-meter/; 3 pages printed Aug. 4, 2014, and describing a product available at least before Jul. 2007.
(Continued)

*Primary Examiner* — Reena Aurora
(74) *Attorney, Agent, or Firm* — Fitch, Even, Tabin & Flannery LLP (57) ABSTRACT

A magnetic field verifier apparatus includes a magnetic field detection element configured to produce a voltage signal in response to an applied magnetic field wherein the voltage signal corresponds to the strength of the applied magnetic field. Substantially identical circuit boards or units are connected to a central unit or mother board to place magnetic field detection elements of each board or unit in an mutually approximately orthogonal relationship. A microcontroller is in communication with the voltage signal. The magnetic field verifier apparatus is configurable to sense particular field strengths at various frequencies and store the readings to provide the user with a reliable verification that a particular magnetic field strength has been produced in a particular environment.

14 Claims, 5 Drawing Sheets

(51) Int. Cl.
*G01R 33/07* (2006.01)
*G01R 35/00* (2006.01)

(56) References Cited

U.S. PATENT DOCUMENTS

| | | |
|---|---|---|
| 7,068,030 B2 | 6/2006 | Hintz et al. |
| 7,075,793 B2 | 7/2006 | Le et al. |
| 7,271,586 B2 | 9/2007 | Bohlinger et al. |
| 7,994,773 B2 | 8/2011 | Schultz |
| 8,717,014 B2 * | 5/2014 | Schultz .................. 324/247 |
| 2002/0163333 A1 * | 11/2002 | Schlicker et al. ............. 324/242 |
| 2007/0080682 A1 | 4/2007 | Govari et al. |
| 2007/0170228 A1 | 7/2007 | Zhao et al. |

FOREIGN PATENT DOCUMENTS

| | | |
|---|---|---|
| JP | 2002286824 A | 10/2002 |
| KR | 20070093422 A | 9/2007 |

OTHER PUBLICATIONS

Alphalab, Inc.; Trifield 100XE Meter Model TF100XE Instructions; http://www.trifield.com/UserFiles/TF100XE2012.pdf; 2 pages printed Aug. 4, 2014, and describing a product available at least before Jul. 2007.

European Extended Search Report; PCT/US2008083109 dated Aug. 12, 2014; 11 pages.

Kim; Search Report; Korean Intellectual Property Office; Jun. 27, 2009; 8 pages, PCT/US2008/083109.

* cited by examiner

APPARATUS AND METHOD FOR IN-FIELD MAGNETIC MEASUREMENTS

CROSS-REFERENCE TO RELATED APPLICATIONS

This application is a continuation application of U.S. patent application Ser. No. 13/193,206, filed Jul. 28, 2011, issued on May 6, 2014 as U.S. Pat. No. 8,717,014, which is a continuation application of U.S. patent application Ser. No. 12/171,626, filed Jul. 11, 2008, issued on Aug. 9, 2011 as U.S. Pat. No. 7,994,773, the content of each of which is fully incorporated herein by this reference.

FIELD OF THE INVENTION

The invention relates generally to magnetic field detectors and more specifically to an apparatus and method for verifying the magnetic fields strengths applied by an apparatus.

BACKGROUND

Many types of magnetic strength measurement devices are known. Generally, they consist of an instrument with amplification and readout elements and a sensor connected to the instrument via a cable. Instruments with built-in sensors are generally used for large volume characterization of weak stray fields, and probes are generally used to measure stronger fields, for example, in coil bores or in narrow gaps between magnetic pole pieces.

A simple sensor of a magnetic field can comprise a coil of wire that responds to a change in magnetic field strength through the coil by outputting electrical power. In that example, a diode connected to a capacitor can collect and store energy from the coil, and a mechanical switch can transfer that energy to a lamp. Intensity of illumination of a lamp can provide an indication of magnetic field strength. In certain applications, however, multi-thousand turn coils are needed to sense particular types of magnetic fields.

Depending on the sensor type, the instrument incorporating the sensor may provide sensor excitation as a portion of the device. For example, a Hall effect sensor element can be excited by an adjustable current. Instruments may also utilize amplifiers to combat noise and, for example, to offset chopper amplification to nullify offset in the measurement of very weak fields. Other instruments have multidirectional measurement capability. For example, multiple Hall sensors can be set close together and orthogonal to each other to form a multidirectional probe.

In certain fields of use, however, general purpose magnetometers cannot reliably confirm the magnetic fields necessary for given applications. For example, in the field of magnetic degaussing, high strength and high frequency magnetic fields are sometimes applied to magnetic storage media, such as magnetic tape, computer hard drives, and the like, to erase any data stored thereon. To confirm that the media is being thoroughly erased, the strengths and directions of the applied magnetic fields must be confirmed. Although general purpose magnetometers may be adaptable to verifying the magnetic fields used in bulk degaussers, bulk degaussers generally apply magnetic fields within relatively contained spaces and provide media restraint or transport devices that interfere with the cable connected probes usually associated with high field strength sensing. Compact, non-wired survey units, however, generally lack high field strength measurement capabilities.

Much simpler known magnetic field detection or characterization devices used in checking fields created by bulk degaussers include visual indicators such as a variable number of blown fuse links. For example, visual indication devices may include self-adhesive thin films of high coercivity material patterned by the manufacturer, developed at point of use with a ferro-fluid that reveals the pattern, and erased by the user in a degausser, thereby providing evidence of magnetic field exposure greater than the coercivity of the material in the visual indication device. The sensitivity of a fusible device or film can be made directional, for example, by being made more resistant to magnetic field strength in the direction of the film than through it. A range of films having different coercivities can be offered. Such sensors can be used in sets of three, each applied to an orthogonal surface of a media sample. Although such fused devices or films provide a "go" or "no go" indication of whether a sensed field reached a particular threshold, or at best, a low resolution comparable to a bar graph indicator, such devices cannot provide a measurement of the actual field strength provided by the degausser.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION OF THE PREFERRED EMBODIMENT(S)

Generally speaking, pursuant to these various embodiments, a magnetic field verifier apparatus for sensing magnetic fields includes a magnetic field detection element configured to produce a voltage signal in response to an applied magnetic field wherein the voltage signal corresponds to the strength of the applied magnetic field. A current source coupled to the magnetic field detection element provides a stimulating current for the magnetic field detection element that builds in a ramp-like progression. A microcontroller is operatively coupled to the voltage signal wherein the microcontroller is configured to detect the ramping time of the magnetic field detection element and to sense after the ramping time the voltage signal from the magnetic field detection element. The apparatus may include various display options including a simple numeric output of peak field or downloading the measured fields to provide additional data to analyze with respect to the magnetic field generating device.

So configured, the magnetic field verifier apparatus allows a user to configure the device to sense particular field strengths with moderate accuracy and resolution at various frequencies. The apparatus can provide the user with a reliable indication or verification that a particular magnetic field strength has been produced in a particular environment, such as providing a rough number corresponding to the peak field detected by the apparatus. The magnetic field verifier apparatus may be re-used and re-calibrated for use in the sometimes hostile environment produced by different magnetic field production devices. The apparatus may be configured with two or more orthogonal components to allow for verification of fields in various directions or dimensions as may be needed for a given application such as magnetic media erasure. Despite having these features, the verifier circuit is relatively simple, cheap relative to coil-based sensors or laboratory grade instruments, and deployable in a form factor similar to magnetic media typically erased by bulk degaussers with ease of use far surpassing a general purpose instrument.

Figure 1:
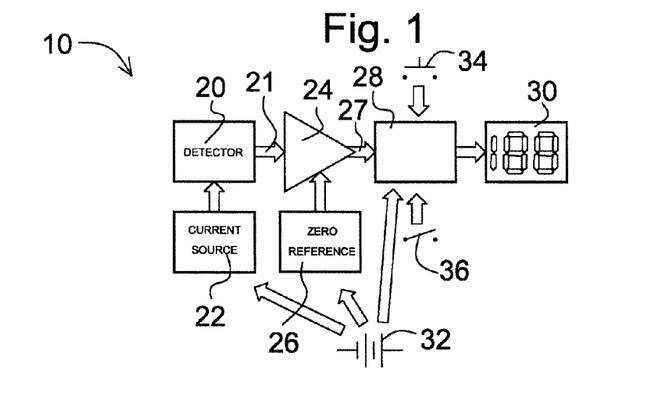
FIG. 1 is a block diagram of an embodiment of a magnetic field verifier.

These and other benefits may become clearer upon making a thorough review and study of the following detailed description. Referring now to the drawings, and in particular to FIG. 1, an illustrative apparatus that is compatible with many of these teachings will now be presented. A magnetic field verifier apparatus 10 for sensing magnetic fields includes a magnetic field detection element 20 configured to produce a voltage signal 21 in response to an applied magnetic field. The applied magnetic field is the field tested by the apparatus 10 and is typically produced by a separate structure including, for example, varying arrays of permanent magnets or electrically driven coils that produce varying magnetic fields.

The magnetic field detection element 20 is stimulated by a current source 22 configured to provide current to the element 20 such that a stimulating current builds up in a ramp-like progression. The magnetic field detection element 20 typically comprises a Hall effect magnetic field sensor, which operates using a current stimulation allowing the sensor to produce a voltage that corresponds to a magnetic field applied to the device. In general, the voltage signal 21 produced by the magnetic field detection element 20 in response to an applied magnetic field varies linearly with both the applied magnetic field strength and the stimulating current applied to the magnetic field detection element 20. Accordingly, the voltage signal 21 will correspond to the applied magnetic field at some particular value of the ramping current.

A microcontroller 28 is operatively coupled to the magnetic field detection element 20 to produce and detect a current ramping time of the element 20 and to sense or measure after the ramping time the voltage signal from the element 20. An amplifier 24 is coupled to the magnetic field detection element 20 to receive the voltage signal 21 produced by the element 20 and to provide an amplified voltage signal 27 that is received by the microcontroller 28. The amplifier 24 includes an input to receive a zero reference voltage from a zero reference circuit 26. The zero reference voltage is provided to the amplifier 24 in this example such that the amplifier 24 can provide an amplified voltage signal 27 corresponding to an applied magnetic field strength of zero, wherein the amplified voltage signal 27 corresponding to zero magnetic field is about half the supply voltage provided by battery 32. In this way, voltages from the magnetic field detection element 20 caused by increasing strength of the magnetic field in a first direction result in increasing voltage of signal 27 above the zero reference voltage, and voltages from the magnetic field detection element 20 caused by increasing strength in a second direction opposite the first direction result in decreasing voltage of voltage signal 27 below the zero reference voltage.

Figure 2:
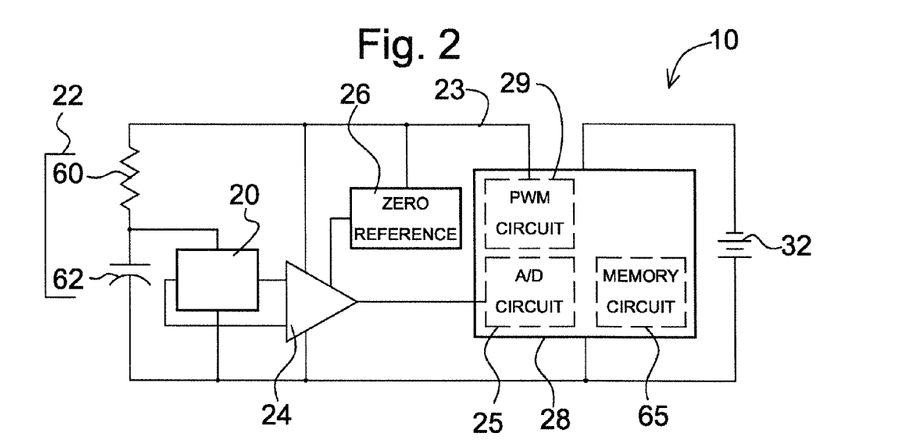
FIG. 2 is a circuit diagram of an embodiment of a magnetic field verifier.

With continuing reference to FIGS. 1 and 2, a more detailed approach to building an example circuit for the verifier apparatus will be described. By one approach for applying current, the current source 22 includes a capacitor 62 operatively coupled across the magnetic field detection element 20 such that an applied voltage, for example from a battery 32, creates the stimulating current that builds in a ramp-like progression. The current source 22 may also include a resistor 60 with a first end operatively connected to the capacitor 62 and the magnetic field detection element 20. A second end of the resistor 60 is operatively connected to an output pin of the microcontroller 28 that provides a voltage source to the line 23, such that the resistance of the resistor 60 relative to the resistance of the magnetic field detection element 20 in combination with the voltage on line 23 approximates a current source 22. The value of the resistor 60 in this example is relatively large compared to the magnetic field detection element's 20 nominal input resistance, and the configuration approaches the operation of an ideal current source with reduced power consumption by the magnetic field detection element 20.

To power the circuit, the microcontroller 28 can direct power from a battery 32 to a single output pin that powers the current source 22, the amplifier 24, and a zero reference voltage circuit 26. By another approach, power for the amplifier 24, the zero reference voltage circuit 26, and the current source 22 may be supplied by a switching device or other circuitry powered by the battery 32 and activated by the microcontroller 28, for example if a single microcontroller output pin cannot supply the total load. By another approach, multiple output pins of the microcontroller 28 can supply various components, so that the voltage supply for the amplifier 24 may be supplied separately and substantially continuously to avoid settling time at activation of the circuit. The microcontroller 28, the amplifier 24, and the zero reference voltage circuit 26 can be selected for relatively low operational power consumption.

The microcontroller 28 of FIG. 2 includes a pulse width modulator circuit 29 that controls and senses the ramping time of the magnetic field detection element 20. In such a configuration, the microcontroller 28 applies voltage pulses controlled by the pulse width modulator circuit 29 to the capacitor 62 and resistor 60 via line 23 such that in response to receiving the voltage pulse, the capacitor 62 and resistor 60 apply a ramping current to the magnetic field detection element 20. In this way, the microcontroller 28 can control the operation of the magnetic field detection element 20.

In another approach, the microcontroller 28 may be configured through firmware or direct hardware links to coordinate the voltage pulses on line 23 and the sampling of information from the amplifier 24. The amplified voltage output 27 from the amplifier 24 is typically received by an analog to digital ("A/D") converter circuit 25 (often built into the microcontroller 28) to provide a digital numeric value relating to the sensed magnetic field that can be stored and/or displayed as described herein. The timing of sampling from the A/D converter circuit 25 can therefore be controlled by the microcontroller 28 to match the timing of the application of pulses to the magnetic field detection element 20. The pulse width modulated output from the microcontroller 28 can also provide a different approach to powering the amplifier 24.

To improve battery life, the microcontroller 28 can be powered in stop mode when not in use, for example, after a predetermined count of sensor measurement cycles. The stop mode power is generally low enough that an on-off switch to be actuated by a user is not needed when a stop mode is built into the device. Activation of the reset switch 34 can start the microcontroller's 28 internal oscillators to "wake" the device from stop mode, and after initializing the device, firmware starts and repeats the sequence of measurements described herein. Some number of initial measurements, for example over the duration of a lamp test, can assume zero magnetic strength because reset often can only be accessed outside the confines of the magnetic field generating apparatus to be tested, such as a degausser. One of those measurements, or an average of several, can be stored in a memory circuit 65 to represent the value of zero magnetic applied field for use in subsequent calculations of magnetic strength absolute value. Operation of the device may continue for a predetermined time greater than that needed for an operation of the magnetic field generator being tested and retrieval of the device to observe the result. Firmware can then stop the microcontroller 28. The apparatus 10 may also include a calibration switch 36 operatively coupled to the microcontroller 28 such that operation of the calibration switch 28 signals the microcontroller 28 to operate in a calibration mode as described below.

The apparatus 10 may also include a memory circuit 65 for storing various types of data as may be needed or created by the circuit. For example, the memory circuit 65 may store information relating to the voltage signal 21 from the magnetic field detection element 20, information represented by the amplified voltage output 27 from the amplifier 24, and information converted to digital output by the A/D converter circuit 25. Stored values may represent an initial measurement corresponding to zero magnetic field strength, or the stored values may represent an output value or values to be displayed or analyzed. Such a memory circuit 65 is commonly included in the circuitry of the microcontroller 28 or may be a separate memory structure as is known in the art. A nonvolatile programmable memory type of memory circuit 65 may store a calibration value for the calibration method described herein.

The capacitance value of the capacitor 62 can enable the circuitry of FIG. 2 to operate in either of two modes. In a first possible mode, the capacitor 62 has a relatively large capacitor value that approximately results in a low pass filtering of the modulated voltage applied to the resistor 60 during current generation, and the amplifier 24 should be powered separately and continuously by a separate microcontroller 28 power output. Then, with a pulse width modulation frequency greater than the sampling rate, the magnetic field detection element 20 will experience approximately average current excitation that can be varied by the duty (pulse width) of the pulse width modulation to achieve calibration for sensitivity variation that is typical of a Hall effect device (as may be used as the element 20). In this case, a factor stored in a nonvolatile memory circuit 65 of the microcontroller 28 at calibration can correct for variation by setting the pulse width modulation duty. To counter electronic ripple, the microcontroller 28 can synchronize the sampling from the amplifier 24 through its analog to digital conversion function with a modulation pulse to counter ripple in the stimulation.

In a second possible operation mode, a relatively small value of the capacitor 62 allows for greater power savings and microcontroller 28 pin savings but creates tighter constraints on the timing requirements of the pulse width modulation relative to the conversion and sampling of the magnetic field detection element 20 voltage signal 21 and on the dynamic performance of the amplifier 24. In this mode, a single pulse determines each sampling interval. The pulse powers the amplifier 24 instantaneously, except for the charging time of decoupling capacitors (not shown) and time required at turn-on for operation of the amplifier 24 to settle. The pulse charges the capacitor 62 through the resistor 60 and provides an approximately linear current ramp through the magnetic field detection element 20. Synchronizing a microcontroller 28 time-out with the triggering pulse on the line 23 can signal the conversion of the voltage signal 27 by the A/D converter circuit 25 to a digital value and determine the magnetic field detection element 20 excitation current for calibration and measurement. The sampling of information typically occurs at about the time the current pulse ends because current from the capacitor 62 continues flowing to the magnetic field detection element 20 after the pulse ends.

Additional variations on the design are possible. For example, if the amplifier 24 has input common mode restrictions at the desired gain, the resistor 60 can be replaced by two resistors connected to each of two separate power supply lines to bias the magnetic field detection element 20 output into an appropriate range for the amplifier 24. Depending on the desired application, amplifiers such as the AD623 (difficult to use because of its common mode versus frequency behavior), the AD620, and the AD8553 (having common mode rejection characteristics that improve with frequency) instrumentation amplifiers among others may be used.

So configured, very few additional common but well-understood components not shown in the illustrations are required, such as decoupling capacitors, to create a commercial embodiment of these teachings. Those skilled in the art will recognize and understand that the components described herein may be comprised of a plurality of physically distinct elements as is suggested by the illustrations shown in FIGS. 1 and 2. It is also possible, however, to view these illustrations as comprising a logical view, in which case one or more of these elements can be enabled and realized via a shared platform. It will also be understood that such a shared platform may comprise a wholly or at least partially programmable platform as are known in the art. All of these architectural options are well known and understood in the art and require no further description here.

The apparatus 10 also includes an output 30 for providing an indication of the sensed magnetic field. The output 30 may be deployed in a number of ways. The output 30 may be operatively connected to the microcontroller 28 such that it is an integral part of the apparatus 10. In this fashion, the output 30 may display a binary indication of whether the applied magnetic field's maximum strength exceeded a predetermined amount. For example, the output 30 may include a green light that lights if the verifier apparatus 10 detects a magnetic field greater than a benchmark amount stored by the apparatus 10 and a red light that lights if the apparatus 10 detects a magnetic field less than the benchmark amount. By another approach, the output 30 may include a numeric output corresponding to the applied magnetic field's maximum strength. For example, the output 30 may be a light emitting diode ("LED") display, liquid crystal display ("LCD") (good for low power consumption and small sizes), or other mechanism known in the art for displaying numbers.

Figure 3:
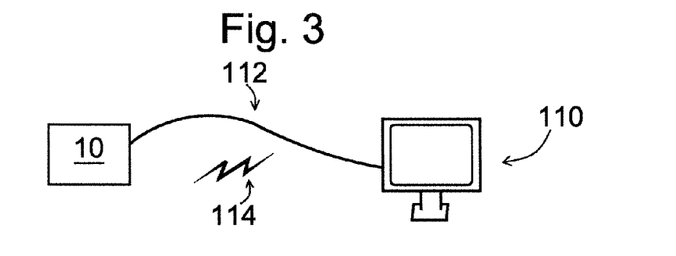
FIG. 3 is a block diagram of various embodiments of a connection between a magnetic field verifier and a display.

By yet another approach, the apparatus 10 may include a removably connectable output 30. In this configuration, the output 30 is a separate device that may be connected to the apparatus 10, thereby being operatively connected to the microcontroller 28 and/or memory circuit 65, to display information relating to the applied magnetic field after the apparatus 10 has completed sensing the field, including character display or graphic display. As illustrated by FIG. 3, in one such approach, the output device may include a computer 110 operatively connected to the apparatus 10 via a wired connection 112 such as through a serial connection or a universal serial bus connection. The connection may also be made via a wireless connection 114 using any wireless protocol as known in the art. In this example, the computer 110 may analyze the data from the apparatus 10 and/or display the data for a user.

In general, the calibration process includes having the microcontroller 28 search for a multiplier, resistance, voltage, pulse width modulation frequency, and/or excitation time that yields conversions of the signals from the magnetic field detection element 20 to a predetermined value representing the known applied magnetic field strength. The following equation:

$$t = R_{TH} \times C_S \times \ln\left(1 - \frac{I_S \times R_H}{V_{TH}}\right)$$

where $$I_S < \frac{V_{TH}}{R_H}$$

describes the relationship among the time t required for the excitation current to ramp to a specific value $I_S$, the Thévenin-equivalent resistance $R_{TH}$ of the resistor 60 and the magnetic field detection element 20 input resistance, the value of the capacitor 62 $C_S$, the resistance $R_H$ of the magnetic field detection element 20 as a Hall effect device, and the Thévenin-equivalent voltage $V_{TH}$ of the battery 32. The maximum current for large time, $V_{TH}/R_H$, and the minimum specified magnetic field detection element 20 sensitivity dictate the fixed gain for the amplifier 24, which is set somewhat higher than the calculated required gain for many device types with a fixed resistor. Then, the desired calibration resolution depends on the slope of the excitation current, generally at the sampling time required for the maximum sensitivity specification at a particular magnetic field frequency. That resolution sets the pulse width modulation resolution required for a given application. Component values should also allow $I_S$ to approach maximum for the most insensitive elements within a sampling interval, generally set to the pulse width modulation period.

Figure 4:
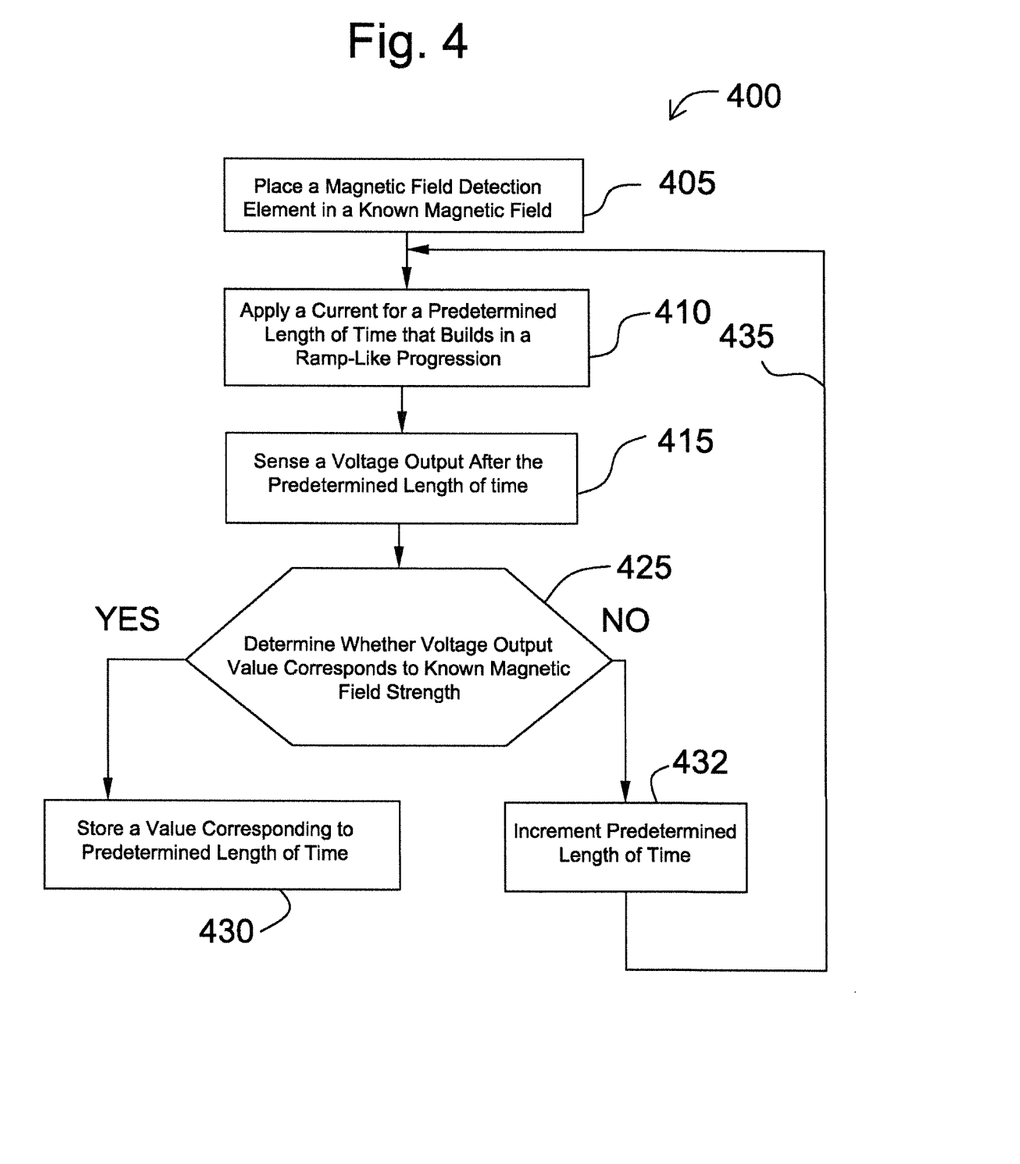
FIG. 4 is a flow diagram of a method of calibrating a magnetic field verifier.

With reference to FIG. 4, an example calibration method 400 includes placing 405 a magnetic field detection element 20 in a known magnetic field and applying 410 to the magnetic field detection element 20 a current that builds in a ramp-like progression for a predetermined length of time. A microcontroller 28 then senses 415 a voltage output from the magnetic field detection element 20 after the predetermined length of time. In other words, the apparatus 10 ramps the current applied to the magnetic field detection element 20 for a set amount of time and captures the information relating to the voltage output from the element 20 at about the expiration of the amount of time that the current is applied.

Using this process 400, at least one value corresponding to the predetermined length of time is stored as a predetermined function of a value corresponding to the voltage output and the known magnetic field. For example, the microcontroller 28 may compare 425 the voltage output to a previously stored value that corresponds to the known magnetic field. At this step, the microcontroller 28 is determining 425 whether the voltage output from the magnetic field detection element 20 is what is expected based on the known magnetic field applied to the element 20. If the voltage from the element 20 is as expected, a value corresponding to the predetermined length of time during which the current built up in the element 20 is stored 430 as an appropriate amount of time to use during the operation of the device. If not, the length of time that the current built up is incremented 432, for example, by starting at a minimum time corresponding to the highest sensitivity for the magnetic field detection element 20 and increasing the time by a short amount at each iteration. The process is repeated 435, including steps 410, 415, and 425, for another iteration. In this manner, the length of time that current builds can be incrementally increased between each iteration until the magnetic field detection element 20 provides a response or voltage output that accurately corresponds to the applied known magnetic field.

The calibration process 400 can be modified in a number of ways. Optionally, a range of predetermined lengths of time for current build-up may be stored over which the magnetic field detection element 20 provides accurate readings for a given known magnetic field. The calibration value may be stored as the average of that range.

The process 400 may be repeated to verify repeatability. The same process 400 can also be repeated for ranges of known magnetic fields to confirm accurate measurements for various expected operating conditions or fields to verify or to save different settings as may correspond to different fields the apparatus 10 may be used to verify. For instance, the apparatus 10 may include a switch with multiple settings such that a user may select a first setting for a first degausser type and a second setting to verify the magnetic field of a second degausser type. The calibration process 400 can also be repeated by applying the known magnetic field in an opposite direction on the magnetic field detection element 20 to verify the same calibration value results when applying the known magnetic field in a first direction and when applying the known magnetic field in the direction opposite the first direction. A difference between the values may indicate a malfunction of the device.

Figure 5:
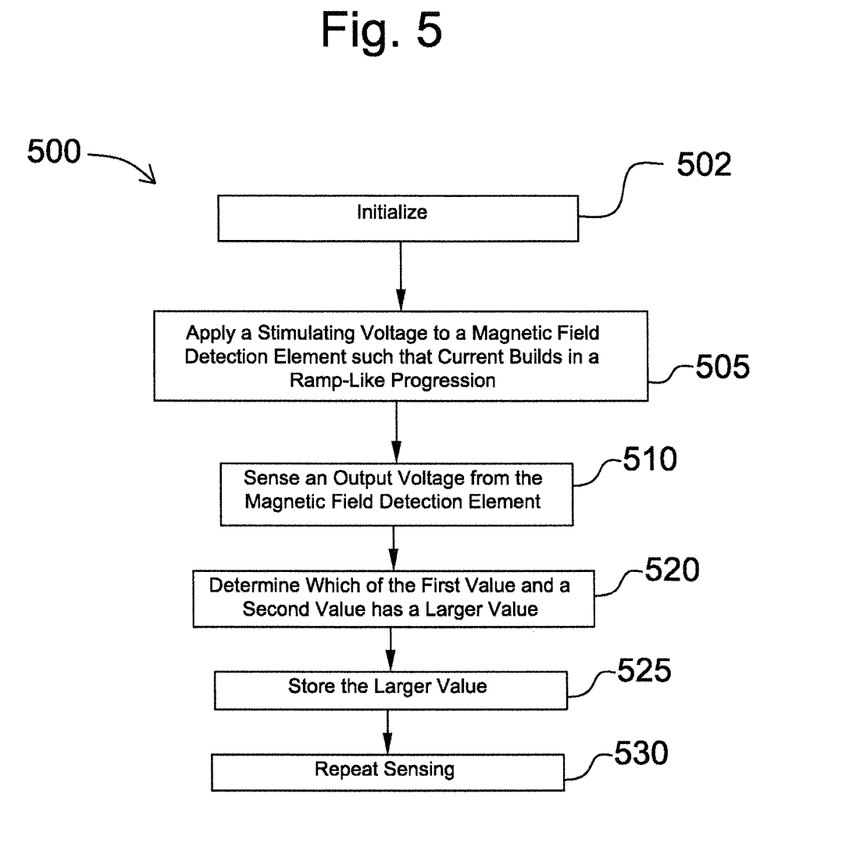
FIG. 5 is a flow diagram of a method of using a magnetic field verifier.

With reference to FIG. 5, a method 500 of operation of the apparatus 10 for sensing an unknown applied magnetic field will be described. The process begins when a user presses the reset button 34 to begin a measurement cycle. During the initialization period 502 an initial group of measurements are taken in what is assumed to be a zero field environment, and these measurements are averaged and stored as a zero field value, although in other approaches only certain measurements may used or averaged to find the zero field value. In other words, the zero field value is typically an average voltage output of the A/D converter circuit 25 with zero applied field during initialization 502. The zero field value is later compared to measurements taken in the magnetic field to be measured. The initialization period is assumed to take place outside of the measured magnetic field, in other words in about a zero magnetic field, because the reset button 34 in typical use cannot be pressed while the apparatus 10 is placed within the confines of the device whose magnetic field is to be checked. The initialization period 502 can last up to one second, or for about four thousand measurements for a typical four thousand Hertz ("Hz") configuration, although other initialization settings are possible.

After the initialization period, a stimulating voltage is applied 505 via a capacitor 62 to a magnetic field detection element 20 such that the current builds in a ramp-like progression. This stimulating voltage is typically applied via pulse width modulation voltage from a microcontroller 28 as described above. In other words, the voltage is applied for the duration of the pulse width, also known as the pulse duty, and removed for the remaining duration of the pulse width's frequency cycle. An output voltage corresponding to a strength of the applied magnetic field from the magnetic field detection element 20 is sensed 510 upon the passing of a predetermined time period after applying the stimulating voltage, typically at or just before the end of the stimulating voltage pulse. The microcontroller 28 then determines 520 whether a first value corresponding to the output voltage is larger than a second value corresponding to a second output voltage in memory, and the larger value is stored 525. The first value corresponding to the output voltage is typically the digital value output by the A/D converter circuit 25, although other values corresponding to the output voltage may be used in the process.

The absolute values of the first and second values are compared in step 520. The absolute value is used because the direction of the magnetic field is generally not of interest when verifying a maximum strength of an applied magnetic field. It is contemplated that the teachings of this disclosure may be modified to sense and display field direction as well. In a typical approach to obtaining the absolute value of the field strength, the smaller of the zero field value obtained at initialization 502 and the magnetic field strength value obtained from the A/D converter circuit at step 510 is subtracted from the larger. Then at step 520, that calculated absolute value of the most recent measurement is compared with a value previously stored in memory 65, which was also initialized with the zero field value. At step 525, the most recent calculated absolute value replaces the previously stored value in memory if the most recent value is the larger value, otherwise the previous value is retained.

After making the comparison and, if larger, storing a new value, steps 505, 510, 520, and 525 are repeated 530 to sense subsequent voltage signals 21 corresponding to the applied magnetic field and to store any subsequent larger values to determine the maximum magnetic field to which the magnetic field detection element 20 was exposed. Therefore, the memory always retains a value representing the strongest magnetic field encountered by the sensor 20 since the last reset and initialization. The operational period is typically about three minutes, which is generally adequate to load the apparatus into any degausser, cycle the degausser, and read the result. The stored largest absolute value may be continually displayed by the output 30 as it changes to provide a continuous display of the highest magnetic field sensed by the apparatus 10 during a given operational period.

By repeating this process for each application of the ramping current, measurements can be taken at a pace several times faster than the highest known bulk magnetic field degausser magnetic field frequency, allowing relatively accurate measurement of the peak field strength of such degaussers. By another approach, a running total of the three or more most recent measurements may be stored to provide a simple digital filtering of the data or for rejection of electrical interference artifacts. The display 30 can be updated at each new highest absolute value detected by the magnetic field detection element 20. By another approach, the display 30 may be updated asynchronously with the current maximum value by a multiplexing scheme to save pin usage of the microcontroller 28. The frequency of repetition of the loops illustrated in FIG. 4 and FIG. 5 are determined by interrupts generated by the pulse width modulator. The loops in FIG. 4 and FIG. 5 or a separate timer hardware and main program firmware implementing the display multiplexing can increment a counter used by the main firmware to determine the time of operation before entering stop mode after operation and display.

By a different approach, the step 520 of determining which of the first and second values is larger may be skipped such that every sensed value is stored to create a database of measurements that can be analyzed and displayed. In this case, a plurality of values corresponding to the output voltage may be stored on the memory circuit 65. One variation on this approach includes determining whether the value exceeds a predetermined value. In this case, the apparatus 10 stores one value and, optionally, its time of occurrence only if the value indicates that the magnetic field applied to the magnetic field detector element 20 exceeds a predetermined threshold to give a user an indication that the threshold field was reached or to limit storage of irrelevant data points.

In various approaches, the operation of the apparatus 10 may include removing the memory circuit 65 from the applied magnetic field and operatively connecting the memory circuit to an output 30. This may be done by removing the entire apparatus from a magnetic field device being tested and connecting the apparatus 10 to a computer 110 or other display device to review the data stored in the memory circuit 65 or by merely removing a module or chip that may be connected to an external device for reading and displaying the stored information. By yet another approach, the data on the memory circuit 65 may be transported to a computer 110 by a wired connection 112 or wireless connection 114.

For the verification of magnetic fields produced by magnetic field degaussers, the displayed measurements need not be particularly precise, and the sensor response need not be particularly linear. Functionally, the readings need only fall near a value appropriate for the particular degausser model being tested and be consistent from measurement to measurement, at daily or hourly intervals. Conversely, measurements stored in memory circuit 65 need not be restricted to a single maximum value, but can represent, for example, a time history of the magnetic fields to which the magnetic field detection element 20 has been exposed.

Those skilled in the art will appreciate that the above-described processes are readily enabled using any of a wide variety of available and/or readily configured platforms, including partially or wholly programmable platforms as are known in the art or dedicated purpose platforms as may be desired for some applications. FIG. 1 illustrates general elements of such an approach, and FIG. 2 provides more detail of the connections between elements of one such approach.

For machines designed to degauss magnetic data storage media by applying strong magnetic fields at various directions to erase data from the media, it is advantageous to measure the magnetic fields produced by such machines at a variety of angles. Typically, fields are applied in two or three dimensions more or less uniformly over large regions to achieve maximum erasure of the magnetic storage media. Accordingly, the teachings of this disclosure can be extended to a three dimensional sensing device such as the example illustrated in FIG. 6.

Figure 6:
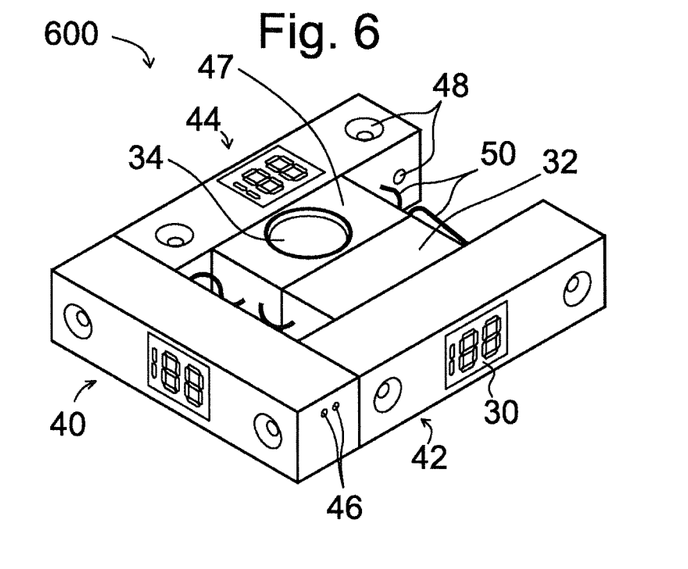
FIG. 6 is a perspective view of a modular embodiment of a magnetic field verifier.

The modular device 600 of FIG. 6 is an example of a device for sensing magnetic fields in at least two directions, and it includes at least two magnetic field detection units, 40, 42, and 44. Each magnetic field detection unit includes a magnetic field detection element 20 configured to produce a voltage signal in response to an applied magnetic field wherein the voltage signal corresponds to the strength of the applied magnetic field. Each unit also includes a capacitor 62 operatively coupled across the magnetic field detection element 20 such that a stimulating current for the magnetic field detection element 20 builds in a ramp-like progression upon application of a stimulating voltage. An amplifier 24 is operatively coupled to the voltage signal from the magnetic field detection element 20 to amplify the voltage signal.

The modular device 600 includes at least one microcontroller 28 operatively coupled to the amplifiers 24 of the magnetic field detection units 40, 42, and 44 wherein the microcontroller(s) 28 are configured to produce the ramping time of each magnetic field detection element 20 and to sense after the ramping time an amplifier signal corresponding to the voltage signal from each magnetic field detection element 20. A display 30 is connectable to the microcontroller 28 for displaying information relating to the sensed magnetic fields as described above. As illustrated in FIG. 6, each magnetic field detection unit 40, 42, and 44 may include a separate display 30 to indicate the magnetic field strength sensed by each magnetic field detection element 20.

In the example of FIG. 6, each magnetic field detection unit 40, 42, and 44 connects to a single central unit 47 that contains the reset switch 34 and associated circuitry or electrical connections such that signals from the reset switch 34 and power from the battery 32 may be distributed to the magnetic field detection units 40, 42, and 44. While each unit's firmware is essentially identical, operation between them need not be synchronized, nor particularly precise in sampling rates or operational time, for example in an approach where each unit 40, 42, and 44 includes a separate microcontroller 28, as long as the minimum rate exceeds the highest frequency of the sensed magnetic field by a few times and the minimum time exceeds the maximum cycle time for the magnetic field generator by a minute or so. For example, for verifying the magnetic fields generated by magnetic field bulk degaussers, sampling at nominally four thousand Hertz ("Hz") for nominally three minutes is generally appropriate.

Each magnetic field detection unit 40, 42, and 44 includes a housing with fasteners such that the magnetic field detection units 40, 42, and 44 are removably securable to each other. By one approach, the housings are securable using mounting holes 48 and conventional fasteners such that the magnetic field detection elements 20 of the magnetic field detection units 40, 42, and 44 are approximately mutually orthogonal to sense the applied magnetic field in three dimensions. The housing of each magnetic field detection unit 40, 42, and 44 is designed to support the magnetic field detection element 20 and associated elements within the housing and for securely connecting the housings of the magnetic field detection unit 40, 42, and 44 to each other and to the central unit 47 via the fasteners in a variety of orientations. For example, the holes 48 can include a threaded hole on the unseen small face of each magnetic field detection unit 40, 42, and 44, so that short flat head screws can attach unit 40 to units 42 and 44, and a longer screw and spacer can attach unit 42 to unit 44.

In a different approach, the central unit 47 may, with some adjustments to firmware, hardware connections, and timing as may be done by one skilled in the art, include a single microcontroller 28 that communicates with the magnetic field detection element 20 and other elements in each magnetic field detection unit 40, 42, and 44. Electronic ports 46 allow for connections between the microcontroller 28 in the central unit 47 and the magnetic field detection elements 20 and associated components in the magnetic field detection units 40, 42, and 44, or in the case where each unit 40, 42, and 44 includes a separate microcontroller 28, the electronic ports 46 allow for connections to the battery 32 and reset switch 34. In this example, a separate unit houses the battery 32 for powering the device, although the battery 32 may also be included in the central unit 47. Multiplicity in the electrical connections can provide for wiring 50 from each unit 40, 42, and 44 to the reset switch 34 and battery 32 that do not extend out of the outer edges of a particular arrangement of the units 40, 42, and 44. Switch connections 46 can be placed anywhere on the modules convenient to calibration of the apparatus.

So configured, the modular design embodiment allows for easy replacement of a magnetic field detection unit or other unit of the device in the case of a failure of any particular unit and enables mass production cost efficiencies. The modular design may also be sized to approximate the size of a typical hard disk drive that is erased by magnetic field degaussers such that the device can easily be placed in such degaussers to test their magnetic fields. It also provides interpretation benefits in that each indicator 30 is associated with the magnetic field applied to the face on which it appears. It also allows the modules to be separated from the apparatus for individual calibration.

Figure 7:
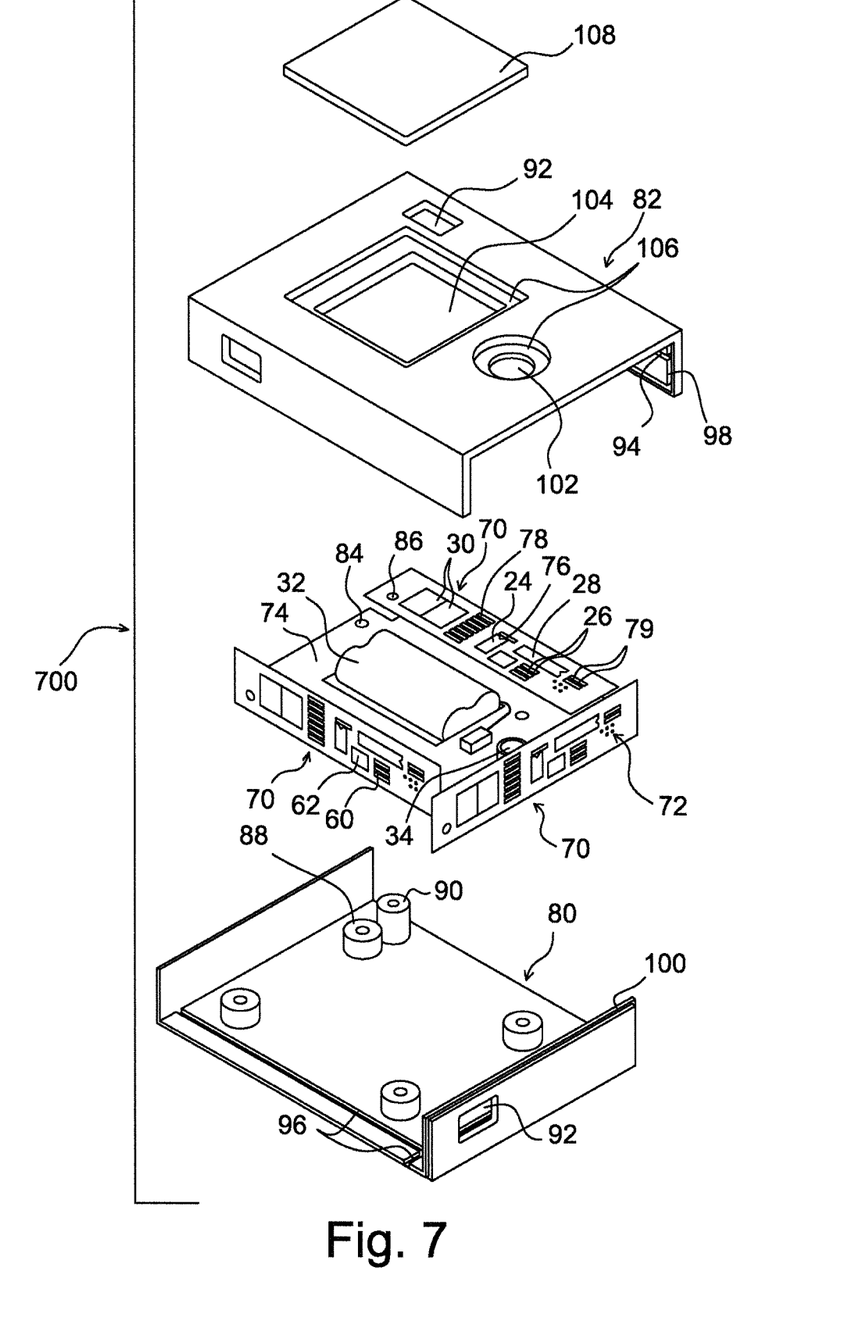
FIG. 7 is an exploded perspective view of an embodiment of a magnetic field verifier.

An example of a three-dimensional verifier 700 contained within a single housing is illustrated in FIG. 7. In this example, the components for a magnetic field detection unit are incorporated onto three substantially identical printed circuit boards 70, which are analogous to the magnetic field detection units 40, 42, and 44 of FIG. 6. The circuit boards 70 are arranged in a mutually orthogonal relationship to sense three dimensions of the applied magnetic field. Each circuit board 70 includes the elements of one approach to the magnetic field sensing apparatus including a numeric display 30, a microcontroller 28, an amplifier 24, a resistor 60, and a capacitor 62.

More specifically, the circuit of each circuit board 70 of the example device 700 in FIG. 7 includes the following. The microcontroller 28 of this example is of the sixteen pin MC9S08QG8CPBE type, which offers a development and programming environment including four defined connections to the two by three array of pins 72. Of the defined connections, normal operation requires one row of three pins for connection to a central mother board 74, one pin for each of power, common, and the reset signal from push button switch 34. The fourth defined connection provides in-circuit programming of the microcontroller (removed from the mother board, as for subsequent calibration), and a fifth pin can signal to the microcontroller 28 to execute its calibration routine. Accordingly, FIG. 7 only illustrates five pins of the pin array 72, with the understanding that the sixth pin is left void in the circuit boards 70 to key with the programming and calibration fixtures used in the production of the circuit boards 70. The mother board 74 requires two styles of single row sockets for interconnection with the circuit boards 70 as are known in the art: one straight connection to the pins of the circuit board 70 mounted parallel to the mother board 74 and two right angle connections to pins of the circuit boards 70 mounted perpendicularly to the mother board 74, which, in this example, includes sockets to distribute the power of the battery 32 to the circuit boards 70. The microcontroller 28 of this example has one pin programmed as a high current and high speed output to pulse width modulate all of the analog components including the amplifier 24, its gain setting resistor 76, the reference resistors 26, the current limiting resistor 60, and the capacitor 62 across the excitation terminals of the magnetic field detection element 20. Using its internal clock, the microcontroller 28 can provide a pulse modulation frequency sufficient for a four thousand Hz sampling rate and allow for approximately four hundred calibration steps of pulse width spanning a ratio of at least 25:1 in range for the pulse widths in order to calibrate magnetic field detection elements that have a sensitivity range from most to least sensitive of at least 3:1. The microcontroller 28 can also trigger an interrupt that accurately synchronizes the start of its internal analog to digital converter with the end of the pulse, corresponding to the excitation current needed to stimulate and calibrate the magnetic field detection element 20.

The magnetic field detection element 20 of the example of FIG. 7 is of the Hall effect, surface mount type, such as a GH-700, sensitive to magnetic field direction orthogonal to its mounting plane, and mounted either under the amplifier 24 or on the circuit board side immediately opposite to it, and therefore unseen in FIG. 7. If an AD620 amplifier is used as the amplifier 24 of FIG. 7, the zero reference input pin impedance of the AD620 amplifier allows the implementation of two 1000 ohm resisters in a resistive voltage divider to act as the zero reference voltage circuit 26, which are resister values that balance power consumption, turn-on speed requirements, pin drive capacity of the microcontroller 28, and overall component count.

The example of FIG. 7 also illustrates the use of LEDs for the output 30 of digits relating to the strength of the sensed magnetic field by means of seven current limiting resistors 78, one for each segment of the pair of two digits. Seven microcontroller pins drive the output 30, and two pins drive the common terminals of the two digits in a multiplexing scheme familiar to those skilled in the art. The circuit boards 70 also include pull-up resistors 79 for programming and calibration pins. The mother board 74 may include a similar pull-up resistor for reset switch 34. Two 3.6 volt lithium chemistry batteries 32 in AA battery form are arranged in a paralleled assemblage to provide enough operating power for the device. The battery assemblage can be constrained against magnetic forces of the operating environment within a rectangular hole of the mother board 74.

The circuit boards 70 are constrained in relation to each other and to the mother board 74 by the housing including the enclosure bottom 80 and the enclosure top 82. The enclosure parts 80 and 82 can be formed of molded high impact plastics or by features machined into flat stock or other suitable materials and subsequently formed by folding along certain of the machined features. The mother board 74 and one end of a horizontal circuit board 70 are secured by fasteners through holes 84 and 86 into threaded bosses such as 88 and 90 into an enclosure bottom 80 or top 82. The housing also includes display windows 92, grooves 94 to support one edge of the horizontal circuit board 70, grooves 96 in cooperation with unseen grooves in the enclosure top 82 to support both edges of the vertical circuit boards 70, grooves 98 around the periphery of the enclosure top 82 that mate with tabs 100 around the periphery of the enclosure bottom 80, a hole 102 for access to the reset switch 34, and a hole 104 for access to the battery 32. An additional machined piece of flat stock is bonded to the enclosure top 82 to provide a recess for the reset switch 34 and support for a battery access lid 108. So configured, the form factor of the device is substantially similar to a typical hard drive for a computer that is erased by bulk magnetic degaussing devices such that the device is readily inserted into such degaussing devices to test the magnetic fields applied by the devices.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

I claim:

1. An apparatus for sensing magnetic fields, the apparatus comprising:
   a mother board comprising:
      a power source,
      at least two amplifiers, and
      a microcontroller;
   at least two magnetic detection elements configured to mount on the mother board and be powered from the power source of the mother board, wherein individual ones of the at least two magnetic detection elements are configured to produce a voltage signal in response to an applied magnetic field wherein the voltage signal corresponds to the strength of the applied magnetic field;
   wherein the at least two amplifiers are operatively coupled to receive respective voltage signals from respective ones of the at least two the magnetic field detection elements;
   wherein the microcontroller is operatively coupled to at least two amplifiers and to detect voltage signals corresponding to the respective voltage signals received by the at least two amplifiers;
   wherein the at least two magnetic detection elements are configured to mount on the mother board in an approximately mutually orthogonal arrangement.

2. The apparatus of claim 1 wherein the mother board comprises a switch configured to send a reset signal to the microcontroller.

3. The apparatus of claim 1 further comprising a connection to communicate with a display.

4. The apparatus of claim 3 further comprising the display.

5. The apparatus of claim 4 wherein the display comprises a removably connectable display.

6. The apparatus of claim 5 wherein the removably connectable display comprises a computer operatively connectable to the microcontroller through at least one of a group comprising a wireless connection, a serial connection, and a universal serial bus connection.

7. The apparatus of claim 1 wherein the at least two magnetic detection elements are mounted to the mother board to withstand repeated exposure to the applied magnetic field as applied by a degaussing apparatus.

8. A method comprising:
   sensing at least two approximately orthogonal components of an applied magnetic field with magnetic field detection elements mounted approximately mutually orthogonal to each other to a motherboard;
   producing voltage signals at the magnetic field detection elements in response to the applied magnetic field wherein the voltage signals corresponds to a strength of the applied magnetic field sensed by the individual magnetic field detection elements;
   receiving at a microcontroller disposed on the motherboard voltage signals corresponding to the voltage signals produced by the magnetic field detection elements;
   receiving at the microcontroller a reset signal from a reset switch;
   resetting operation of the microcontroller in response to the reset signal.

9. The method of claim 8 further comprising displaying an indication of magnitude of the applied magnetic field.

10. The method of claim 9 wherein the displaying comprises displaying a numeric output corresponding to the applied magnetic field's maximum strength.

11. An apparatus for sensing magnetic fields, the apparatus comprising:
    a power source;
    at least two amplifiers;
    at least two microcontrollers;
    at least two magnetic field detection elements configured to be powered from the power source, wherein individual ones of the at least two magnetic detection elements are configured to produce a voltage signal in response to an applied magnetic field wherein the voltage signal corresponds to the strength of the applied magnetic field;

separate individual displays corresponding respectively to individual ones of the at least two magnetic field detection elements, the individual displays configured to display information regarding the strength of the applied magnetic field sensed by the individual ones of the at least two magnetic field detection elements;

wherein the at least two amplifiers are operatively coupled to receive respective voltage signals from respective ones of the at least two the magnetic field detection elements;

wherein the at least two microcontrollers are operatively, separately, and respectively coupled to the at least two amplifiers and to individually detect separate, respective voltage signals corresponding to the respective voltage signals received by the at least two amplifiers;

wherein the at least two magnetic detection elements are configured to mount in an approximately mutually orthogonal arrangement wherein the at least two microcontrollers are configured to control the individual displays to display information regarding a maximum strength of the applied magnetic field sensed by the individual ones of the at least two magnetic field detection elements.

12. The apparatus of claim 11 further comprising a switch configured to send a reset signal to the microcontroller.

13. The apparatus of claim 11 further comprising a connection to communicate with a display.

14. The apparatus of claim 11 wherein the at least two magnetic detection elements are mounted to withstand repeated exposure to the applied magnetic field as applied by a degaussing apparatus.

* * * * *

UNITED STATES PATENT AND TRADEMARK OFFICE
CERTIFICATE OF CORRECTION

| | | |
|---|---|---|
| PATENT NO. | : 9,229,067 B2 | Page 1 of 1 |
| APPLICATION NO. | : 14/268062 | |
| DATED | : January 5, 2016 | |
| INVENTOR(S) | : Robert A. Schultz | |

It is certified that error appears in the above-identified patent and that said Letters Patent is hereby corrected as shown below:

IN THE CLAIMS:

Claim 1, Column 14, Line 12, after "two" delete "the".

Claim 11, Column 15, Line 12, after "two" delete "the".

Signed and Sealed this
Twenty-sixth Day of April, 2016

Michelle K. Lee
*Director of the United States Patent and Trademark Office*